US009257942B2

(12) United States Patent
Chen et al.

(10) Patent No.: US 9,257,942 B2
(45) Date of Patent: Feb. 9, 2016

(54) AUDIO AMPLIFIER APPARATUS

(75) Inventors: Yi-Lung Chen, Keelung (TW);
Hsin-Chieh Huang, Taichung (TW)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 748 days.

(21) Appl. No.: 13/469,085

(22) Filed: May 10, 2012

(65) Prior Publication Data

US 2013/0259267 A1   Oct. 3, 2013

(30) Foreign Application Priority Data

Mar. 29, 2012   (TW) .............................. 101111119 A

(51) Int. Cl.
*H03F 99/00* (2009.01)
*H03F 1/30* (2006.01)
*H03F 3/187* (2006.01)
*H03F 3/21* (2006.01)

(52) U.S. Cl.
CPC ................ *H03F 1/305* (2013.01); *H03F 3/187* (2013.01); *H03F 3/211* (2013.01); *H03F 2203/21109* (2013.01); *H03F 2203/21175* (2013.01); *H03F 2203/21196* (2013.01)

(58) Field of Classification Search
None
See application file for complete search history.

(56) References Cited

U.S. PATENT DOCUMENTS

| 5,796,303 | A  | * | 8/1998  | Vinn et al. ...................... 330/51 |
| 6,040,740 | A  |   | 3/2000  | Dondale |
| 8,279,011 | B2 |   | 10/2012 | Chang et al. ................... 330/297 |
| 2003/0058040 | A1 | * | 3/2003  | Miyagaki et al. ............... 330/10 |
| 2005/0253650 | A1 | * | 11/2005 | Chang et al. ..................... 330/51 |
| 2006/0182265 | A1 | * | 8/2006  | Sorace et al. .................. 379/395 |
| 2009/0284313 | A1 |   | 11/2009 | Huang ............................. 330/10 |
| 2012/0183155 | A1 | * | 7/2012  | Huang et al. ................. 381/94.5 |

FOREIGN PATENT DOCUMENTS

| TW | 200950318 A | 12/2009 | .............. H03F 3/181 |
| TW | 201025830 A | 7/2010  | ................ H03F 1/30 |

* cited by examiner

*Primary Examiner* — Joseph Saunders, Jr.
*Assistant Examiner* — James Mooney
(74) *Attorney, Agent, or Firm* — Slayden Grubert Beard PLLC

(57) ABSTRACT

An audio amplifier apparatus for driving a loudspeaker is provided. The audio amplifier apparatus includes a soft charge unit, a first amplification module, and a second amplification module. The soft charge unit is coupled to the loudspeaker through an output terminal and supplies a driving current according to a first control signal to soft charge the loudspeaker, so as to gradually increase a voltage level on the output terminal. The first amplification module receives an audio signal according to the first control signal and amplifies the audio signal to output a first amplified signal for driving the loudspeaker. The second amplification module receives the audio signal according to a second control signal and amplifies the audio signal to output a second amplified signal for driving the loudspeaker. The soft charge unit generates the second control signal by comparing the voltage level on the output terminal with a predetermined voltage level.

14 Claims, 3 Drawing Sheets

AUDIO AMPLIFIER APPARATUS

CROSS-REFERENCE TO RELATED APPLICATION

This application claims the priority benefit of Taiwan application serial no. 101111119, filed on Mar. 29, 2012. The entirety of the above-mentioned patent application is hereby incorporated by reference herein and made a part of this specification.

BACKGROUND OF THE INVENTION

1. Field of the Invention

The invention generally relates to an amplifier apparatus, and more particularly, to an audio amplifier apparatus capable of inhibiting pop noise.

2. Description of Related Art

When an electronic product is turned on or off, disturbing pop noise is usually given off from its loudspeaker. This pop noise is generated when the voltage on the output terminal of an audio amplifier apparatus for driving the loudspeaker changes drastically and accordingly a spike current is produced. Besides the discomfort brought to the user, sometimes damages may be caused on highly sensitive elements in the loudspeaker by a large spike current. Thereby, how to eliminate pop noise has become a major issue in the design of audio amplifier apparatuses.

Conventionally, an additional soft charge circuit is usually disposed for soft charging the output terminal of the audio amplifier apparatus, so as to gradually increase the voltage level on the output terminal of the audio amplifier apparatus and reduce the pop noise produced when the electronic product is turned on or off. However, when the soft charge circuit finishes its soft charging operation and the loudspeaker switches to its normal operation state, the sudden activation of the audio amplifier apparatus may also cause some pop noises. In addition, the soft charging operation may slow down the boot-up of the audio amplifier apparatus. Accordingly, the quality of the audio amplifier apparatus cannot be effectively improved.

SUMMARY OF THE INVENTION

Accordingly, the invention is directed to an audio amplifier apparatus, in which an output terminal is gradually charged by a soft charge unit, and a loudspeaker is driven by amplification modules of different driving capabilities according to the soft-charged state of the output terminal.

The invention provides an audio amplifier apparatus suitable for driving a loudspeaker. The audio amplifier apparatus includes a soft charge unit, a first amplification module, and a second amplification module. The soft charge unit is coupled to the loudspeaker through an output terminal. The soft charge unit supplies a driving current according to a first control signal to soft charge the loudspeaker, so as to gradually increase the voltage level on the output terminal. The first amplification module is coupled to the output terminal. The first amplification module receives an audio signal according to the first control signal and amplifies the audio signal to output a first amplified signal for driving the loudspeaker. The second amplification module is coupled to the output terminal. The second amplification module receives the audio signal according to a second control signal and amplifies the audio signal to output a second amplified signal for driving the loudspeaker. The soft charge unit generates the second control signal by comparing the voltage level on the output terminal with a predetermined voltage level.

According to an embodiment of the invention, the driving capability of the first amplification module is lower than the driving capability of the second amplification module.

According to an embodiment of the invention, the predetermined voltage level is equal to one-$N^{th}$ of the voltage level of a supply voltage received by the audio amplifier apparatus, wherein N is a positive real number.

According to an embodiment of the invention, when the soft charge unit determines that the voltage level on the output terminal is equal to the predetermined voltage level, the soft charge unit enables the second control signal to allow the second amplification module to receive the audio signal, so as to generate the second amplified signal.

According to an embodiment of the invention, when the second control signal is enabled, the first control signal is disabled so that the soft charge unit stops soft charging the loudspeaker and the first amplification module stops receiving the audio signal.

According to an embodiment of the invention, the first amplification module includes a first amplifier and a first capacitor. The first amplifier has an input terminal and an output terminal, wherein the input terminal receives the audio signal, and the output terminal outputs the first amplified signal. The first capacitor has a first end and a second end, wherein the first end is coupled to the input terminal of the first amplifier, and the second end is coupled to the output terminal of the first amplifier.

According to an embodiment of the invention, the first amplification module further includes a first resistor, a first switch, and a second switch. The first resistor has a first end and a second end, wherein the first end is could to the output terminal of the first amplifier. The first switch has a first terminal and a second terminal, wherein the first terminal receives the audio signal, and the second terminal is coupled to the input terminal of the first amplifier and the first end of the first capacitor. The first switch is turned on or off according to the first control signal. The second switch has a first terminal and a second terminal, wherein the first terminal is coupled to the second end of the first resistor, and the second terminal is coupled to the output terminal of the first amplifier. The second switch is turned on or off according to the first control signal. When the voltage level on the output terminal is not equal to the predetermined voltage level, the first switch and the second switch are turned on according to the first control signal, and when the voltage level on the output terminal is equal to the predetermined voltage level, the first switch and the second switch are turned off according to the first control signal.

According to an embodiment of the invention, the second amplification module includes a second amplifier and a second capacitor. The second amplifier has an input terminal and an output terminal, wherein the input terminal receives the audio signal, and the output terminal outputs the second amplified signal. The second capacitor has a first end and a second end, wherein the first end is coupled to the input terminal of the second amplifier, and the second end is coupled to the output terminal of the second amplifier.

According to an embodiment of the invention, the second amplification module further includes a third switch. The third switch has a first terminal and a second terminal, wherein the first terminal receives the audio signal, and the second terminal is coupled to the input terminal of the second amplifier and the first end of the second capacitor. The third switch is turned on or off according to the second control signal. When the voltage level on the output terminal is not equal to the predetermined voltage level, the third switch is turned off according to the second control signal, and when the voltage level on the output terminal is equal to the predetermined voltage level, the third switch is turned on according to the second control signal.

According to an embodiment of the invention, the audio amplifier apparatus further includes a first feedback resistor and a second feedback resistor. The first feedback resistor has a first end and a second end, wherein the first end receives the audio signal, and the second end is coupled to the input terminals of the first amplifier and the second amplifier. The second feedback resistor has a first end and a second end, wherein the first end is coupled to the second end of the first feedback resistor and the input terminals of the first amplifier and the second amplifier, and the second end is coupled to the soft charge unit and the output terminals of the first amplifier and the second amplifier.

According to an embodiment of the invention, the audio amplifier apparatus further includes a pre-amplifier. The pre-amplifier has a first input terminal, a second input terminal, and an output terminal, wherein the first input terminal is coupled to the output terminal of the audio amplifier apparatus, the second input terminal is coupled to a predetermined voltage, and the output terminal is coupled to the first amplification module and the second amplification module.

According to an embodiment of the invention, the soft charge unit includes a current source, a first soft charge switch, a delay capacitor, and a delay resistor. The current source supplies the driving current according to a supply voltage. The first soft charge switch has a first terminal and a second terminal, wherein the first terminal is coupled to the current source. The first soft charge switch is turned on or off according to the first control signal. The delay capacitor has a first end and a second end, wherein the first end is coupled to the second terminal of the first soft charge switch, and the second end is coupled to a ground voltage. The delay resistor has a first end and a second end, wherein the first end is coupled to the second terminal of the first soft charge switch and the first end of the delay capacitor, and the second end is coupled to the first amplification module and the second amplification module. When the first soft charge switch is turned on according to the first control signal, the driving current gradually increases the voltage level on the output terminal through the delay capacitor and the delay resistor.

According to an embodiment of the invention, the soft charge unit further includes a second soft charge switch. The second soft charge switch has a first terminal and a second terminal, wherein the first terminal is coupled to the second end of the delay resistor, and the second terminal is coupled to the output terminal of the audio amplifier apparatus. The second soft charge switch is turned on or off according to the first control signal.

According to an embodiment of the invention, when the soft charge unit determines that the voltage level on the output terminal is not equal to the predetermined voltage level, the first soft charge switch and the second soft charge switch are turned on according to the first control signal, and when the soft charge unit determines that the voltage level on the output terminal is equal to the predetermined voltage level, the first soft charge switch and the second soft charge switch are turned off according to the first control signal.

According to an embodiment of the invention, the soft charge unit further includes a comparator and a latch. The comparator has a first input terminal, a second input terminal, and an output terminal, wherein the first input terminal is coupled to a predetermined voltage, the second input terminal is coupled to the second terminal of the second soft charge switch and the output terminal of the audio amplifier apparatus, and the output terminal outputs a comparison signal. The comparator generates the comparison signal according to the comparison result between the voltage level on the output terminal of the audio amplifier apparatus and the predetermined voltage level of a predetermined voltage. The latch is coupled to the output terminal of the comparator. The latch generates the second control signal by latching the comparison signal.

According to an embodiment of the invention, the first control signal and the second control signal are inverse to each other.

According to an embodiment of the invention, the loudspeaker is a speaker.

As described above, in an audio amplifier apparatus provided by an embodiment of the invention, a loudspeaker is soft-charged by using a soft charge unit to gradually increase the voltage level on an output terminal of the audio amplifier apparatus, and amplification modules of different driving capabilities are switched according to the soft-charged state of the loudspeaker, so that any spike current produced when the loudspeaker is switched from the soft-charged state to its normal operation state can be effectively eliminated. Moreover, because the voltage levels inside the amplification modules of the audio amplifier apparatus are set up when the loudspeaker is soft-charged, the loudspeaker can quickly enter its normal operation state after it is powered on. Thereby, in an embodiment of the invention, the pop noise produced when the loudspeaker is powered on is effectively reduced and the boot-up of the loudspeaker is sped up. In other words, a high-quality and comfortable audio experience is brought to the user.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
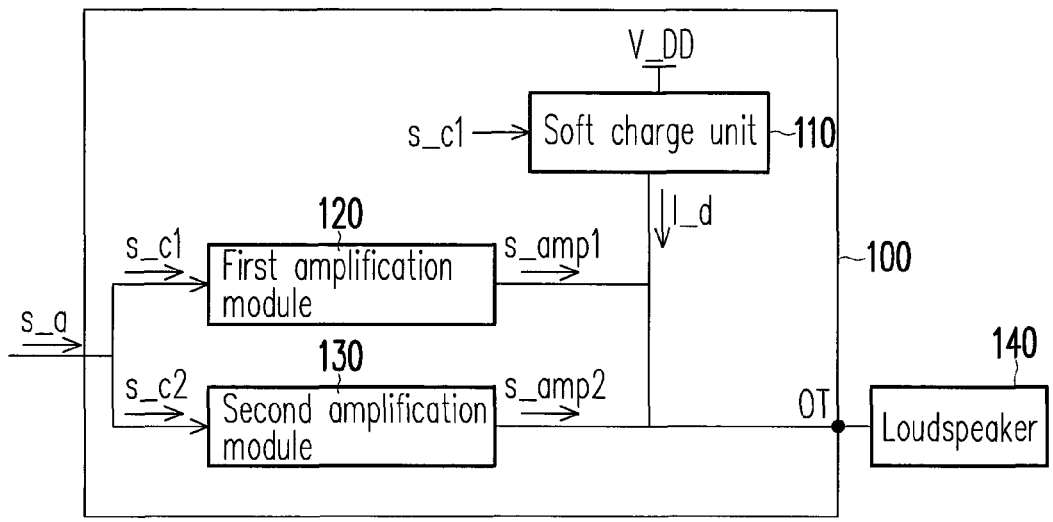
FIG. 1 is a diagram of an audio amplifier apparatus 100 according to an embodiment of the invention.

An embodiment of the invention provides an audio amplifier apparatus, in which a loudspeaker is soft-charged when the audio amplifier apparatus is powered on, and amplification modules of different driving capabilities are switched for amplifying an audio signal according to the soft-charged state, so that the pop noise produced due to the spike current in the loudspeaker when the loudspeaker changes its state is reduced. Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of an audio amplifier apparatus 100 according to an embodiment of the invention. In the present embodiment, the audio amplifier apparatus 100 includes a soft charge unit 110, a first amplification module 120, and a second amplification module 130. In the present embodiment, the audio amplifier apparatus 100 drives a loudspeaker 140 so that the loudspeaker 140 can transform an audio signal s_a into sound and output the sound. Herein the loudspeaker 140 is a speaker.

Referring to FIG. 1, the soft charge unit 110 is coupled to the loudspeaker 140 through an output terminal OT. The soft charge unit 110 supplies a driving current I_d for soft charging the loudspeaker 140 according to a first control signal s_c1, so as to gradually increase the voltage level on the output terminal OT. The first amplification module 120 is coupled to the output terminal OT. The first amplification module 120 receives the audio signal s_a according to the first control signal s_c1 and amplifies the audio signal s_a to output a first amplified signal s_amp1 for driving the loudspeaker 140. Similarly, the second amplification module 130 is coupled to the output terminal OT. The second amplification module 130 receives the audio signal s_a according to a second control signal s_c2 and amplifies the audio signal s_a to output a second amplified signal s_amp2 for driving the loudspeaker 140. The driving capability of the first amplification module 120 is lower than the driving capability of the second amplification module.

Figure 2:
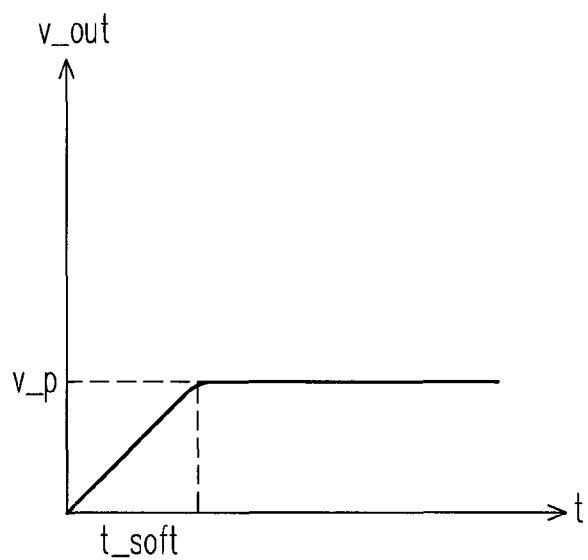
FIG. 2 is a diagram illustrating the transient response at an output terminal OT in FIG. 1.

FIG. 2 is a diagram illustrating the transient response at an output terminal OT in FIG. 1. In FIG. 2, the abscissa indicates the charging time t of the output terminal OT, and the ordinate indicates the voltage level v_out on the output terminal OT. Referring to both FIG. 1 and FIG. 2, when the loudspeaker 140 is powered on, the first control signal s_c1 is enabled, and the soft charge unit 110 biases the loudspeaker 140 according to the enabled first control signal s_c1 through the output terminal OT by using a supply voltage V_DD, so as to supply a driving current I_d and gradually increase the voltage level v_out during a soft charge period t_soft (for example, several milliseconds). When the voltage level v_out is equal to a predetermined voltage level v_p, the loudspeaker 140 enters its normal operation state. Meanwhile, the soft charge unit 110 stops soft charging the loudspeaker 140. It should be noted that when the fixed predetermined voltage level v_p is reached, a smaller slope of the curve in FIG. 2 represents a longer soft charge period t_soft and a slower increase of the voltage level v_out. Thus, pop noise produced when the voltage level v_out changes drastically can be avoided.

To be specific, when the loudspeaker 140 is powered on, the first amplification module 120 also receives the audio signal s_a according to the enabled first control signal s_c1 and amplifies the audio signal s_a to output the first amplified signal s_amp1 for driving the loudspeaker 140. Additionally, because the second control signal s_c2 is still disabled, the second amplification module 130 does not perform any operation.

The voltage level v_out gradually increases with the charging time until the soft charge unit 110 determines that the voltage level v_out on the output terminal OT is equal to the predetermined voltage level v_p. Once the soft charge unit 110 determines that the voltage level v_out on the output terminal OT is equal to the predetermined voltage level v_p, the soft charge unit 110 enables the second control signal s_c2 and disables the first control signal s_c1, so that the soft charge unit 110 stops soft charging the loudspeaker 140. Namely, in the present embodiment, the first control signal s_c1 and the second control signal s_c2 are inverse to each other. Thus, the voltage level v_out remains the predetermined voltage level v_p after the soft charge period t_soft is passed.

It should be noted that the predetermined voltage level v_p is equal to one-$N^{th}$ of voltage level of the supply voltage V_DD received by the audio amplifier apparatus 100, wherein N is a positive real number not smaller than 1. In the present embodiment, N is 2. Namely, in the present embodiment, when the voltage level v_out is increased to half of voltage level of the supply voltage V_DD (i.e., the operating voltage of the loudspeaker 140), the soft charging action is stopped to shorten the starting time of the loudspeaker 140. However, the value of N is not limited in the invention and should be determined according to the actual design requirement.

On the other hand, when the voltage level v_out is equal to the predetermined voltage level v_p, the second amplification module 130 receives the audio signal s_a according to the enabled second control signal s_c2 to generate the second amplified signal s_amp2. In addition, because the first control signal s_c1 is disabled correspondingly, the first amplification module 120 stops generating the first amplified signal s_amp2.

In other words, when the audio amplifier apparatus 100 is boot up, the soft charge unit 110 soft charges the output terminal OT and biases the output terminal OT to the predetermined voltage level v_p after the soft charge period t_soft is passed. Herein the audio amplifier apparatus 100 switches from the first amplification module 120 of a lower driving capability to the second amplification module 130 of a higher driving capability to amplify the audio signal s_a.

To be specific, the first amplification module 120 and the second amplification module 130 are switched according to the soft-charged state of the output terminal OT. When the soft charge unit 110 soft charges the output terminal OT, the first amplification module 120 of the lower driving capability sets up the voltage levels on the input terminal and the output terminal thereof at the same time when it outputs the first amplified signal s_amp1 according to the audio signal s_a. During the soft charge period t_soft, because the voltage level v_out on the output terminal OT remains lower than the predetermined voltage level v_p and the first amplified signal s_amp1 is an amplified signal of relatively low driving capability, the loudspeaker 140 does not output any undesired sound.

Once the soft charging action stops, the audio amplifier apparatus 100 switches from the first amplification module 120 to the second amplification module 130 for driving the loudspeaker 140. Because the first amplification module 120 has set up the voltage levels on the input terminal and the output terminal thereof during the soft charge period t_soft, when the audio amplifier apparatus 100 switches to the second amplification module 130, the second amplification module 130 of the higher driving capability can directly amplify the audio signal s_a according to the voltage levels set up by the first amplification module 120. Besides, because the loudspeaker 140 has been biased to a normal operating voltage, the loudspeaker 140 can normally output sound according to the second amplified signal s_amp2.

In a general power amplifier with the soft charge function, a spike current may be generated when the soft charging action stops and the normal operation state is entered, and the spike current will cause the loudspeaker to give off pop noises. However, in the audio amplifier apparatus 100 provided by the present embodiment, voltages in the amplification modules are set up during the soft charge period, so that when the soft charging action stops and the normal operation state is entered, it can be switched seamlessly from the first amplification module 120 to the second amplification module 130 and accordingly the pop noise can be reduced.

Figure 3:
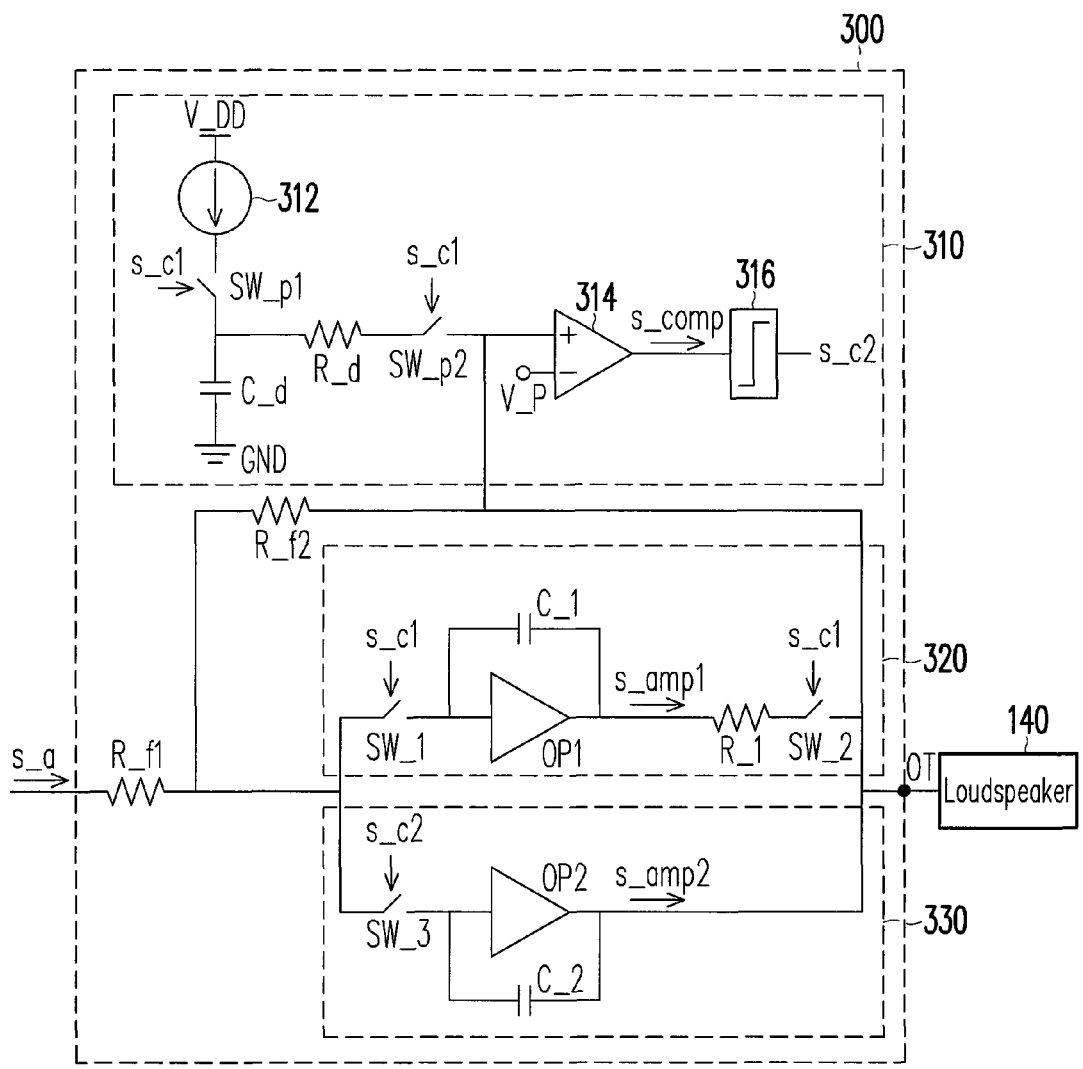
FIG. 3 is a circuit diagram of an audio amplifier apparatus 300 according to an embodiment of the invention.

FIG. 3 is a circuit diagram of an audio amplifier apparatus 300 according to an embodiment of the invention. Referring to FIG. 3, the audio amplifier apparatus 300 includes a soft charge unit 310, a first amplification module 320, and a second amplification module 330. Besides, the audio amplifier apparatus 300 further includes a first feedback resistor R_f1 and a second feedback resistor R_f2 coupled between the input terminal and the output terminal OT of the audio amplifier apparatus 300 for providing negative feedback signal paths to the first amplification module 320 and the second amplification module 330. The overall signal amplification gain of the audio amplifier apparatus 300 is obtained by dividing the resistance of the second feedback resistor R_f2 by the resistance of the first feedback resistor R_f1.

In the present embodiment, the soft charge unit 310 includes a current source 312, a first soft charge switch SW_p1, a second soft charge switch SW_p2, a delay capacitor C_d, a delay resistor R_d, a comparator 314, and a latch 316.

In the soft charge unit 310, when the loudspeaker 140 is powered on, the current source 312, the first soft charge switch SW_p1, the second soft charge switch SW_p2, the delay capacitor C_d, and the delay resistor R_d supply a driving current I_d to the loudspeaker 140 to gradually increase the voltage level v_out on the output terminal OT to a predetermined voltage level v_p, so as to allow the loudspeaker 140 to work normally.

The first terminal of the first soft charge switch SW_p1 is coupled to the current source 312. The first soft charge switch SW_p1 is turned on or off according to the first control signal s_c1. The first end of the delay capacitor C_d is coupled to the second terminal of the first soft charge switch SW_p1, and the second end of the delay capacitor C_d is coupled to a ground voltage GND. The first end of the delay resistor R_d is coupled to the second terminal of the first soft charge switch SW_p1 and the first end of the delay capacitor C_d. The first terminal of the second soft charge switch SW_p2 is coupled to the second end of the delay resistor R_d, and the second terminal of the second soft charge switch SW_p2 is coupled to the output terminal OT. Besides, the second soft charge switch SW_p2 is also turned on or off according to the first control signal s_c1.

Referring to both FIG. 2 and FIG. 3, when the loudspeaker 140 is powered on, the first control signal s_c1 is enabled, and accordingly the first soft charge switch SW_p1 and the second soft charge switch SW_p2 are turned on. Thus, the driving current I_d supplied by the current source 312 according to the supply voltage V_DD gradually increases the voltage level v_out on the output terminal OT through a RC circuit composed of the delay capacitor C_d and the delay resistor R_d during the soft charge period. Herein the length of the soft charge period is determined by the RC time constants of the delay capacitor C_d and the delay resistor R_d. In addition, when the resistance of the delay resistor R_d is far greater than the resistance of the load on the loudspeaker 140, the voltage drop on the load of the loudspeaker 140 is very low, and accordingly the pop noise is further reduced. Thereby, in circuit design, a delay resistor R_d having a greater resistance is usually adopted to reduce the pop noise produced in the loudspeaker 140.

On the other hand, in the soft charge unit 310, the comparator 314 and the latch 316 determine whether to enable the second control signal s_c2 according to the voltage level v_out, so as to determine whether to stop soft charging the loudspeaker 140. Additionally, when the second control signal s_c2 is enabled by the latch 316, the audio amplifier apparatus 300 switches from the first amplification module 320 to the second amplification module 330 and amplifies the audio signal s_a accordingly.

The first input terminal of the comparator 314 is coupled to a predetermined voltage V_P, the second input terminal thereof is coupled to the second terminal of the second soft charge switch SW_p2 and the output terminal OT, and the output terminal thereof generates a comparison signal s_comp according to the comparison result between the voltage level v_out and the predetermined voltage level v_p. The latch 316 is coupled to the output terminal of the comparator 314. The latch 316 generates the second control signal s_c2 by latching the comparison signal s_comp.

To be specific, during the soft charge period, the voltage level v_out on the output terminal OT continuously increases and converges towards the predetermined voltage level v_p. When the comparator 314 determines that the voltage level v_out is equal to the predetermined voltage level v_p supplied by the predetermined voltage V_P, the comparator 314 generates an enabled comparison signal s_comp at the output terminal thereof, so as to allow the latch 316 to enable the second control signal s_c2. Herein because the second control signal s_c2 is enabled, the first control signal s_c1 is disabled correspondingly. In other words, the first control signal s_c1 and the second control signal s_c2 are inverse to each other in the present embodiment. Thus, the first soft charge switch SW_p1 and the second soft charge switch SW_p2 are turned off according to the disabled first control signal s_c1, and accordingly the soft charge unit 310 stops soft charging the loudspeaker 140.

In other words, when the soft charge unit 310 determines that the voltage level v_out is not equal to the predetermined voltage level v_p, the first soft charge switch SW_p1 and the second soft charge switch SW_p2 are turned on according to the first control signal s_c1, so as to soft charge the loudspeaker 140. Contrarily, when the soft charge unit 310 determines that the voltage level v_out is equal to the predetermined voltage level v_p, the first soft charge switch SW_p1 and the second soft charge switch SW_p2 are turned off according to the first control signal s_c1, so as to stop soft charging the loudspeaker 140.

In the present embodiment, the first amplification module 320 includes a first amplifier OP1, a first capacitor C_1, a first resistor R_1, a first switch SW_1, and a second switch SW_2. The input terminal of the first amplifier OP1 receives the audio signal s_a, and the output terminal thereof outputs the first amplified signal s_amp1. The first end of the first capacitor C_1 is coupled to the input terminal of the first amplifier OP1, and the second end thereof is coupled to the output terminal of the first amplifier OP1, wherein the first capacitor C_1 is a phase compensation capacitor disposed for ensuring the operation phase margin of the first amplifier OP1. The first terminal of the first switch SW_1 receives the audio signal s_a, and the second terminal thereof is coupled to the input terminal of the first amplifier OP1 and the first end of the first capacitor C_1, wherein the first switch SW_1 is turned on or off according to the first control signal s_c1. The first end of the first resistor R_1 is coupled to the output terminal of the first amplifier OP1. The first terminal of the second switch SW_2 is coupled to the second end of the first resistor R_1, and the second terminal thereof is coupled to the output terminal of the first amplifier OP1.

Similarly, the second amplification module 330 includes a second amplifier OP2, a second capacitor C_2, and a third switch SW_3. The input terminal of the second amplifier OP2 receives the audio signal s_a, and the output terminal thereof outputs the second amplified signal s_amp2. The first end of the second capacitor C_2 is coupled to the input terminal of the second amplifier OP2, and the second end thereof is coupled to the output terminal of the second amplifier OP2, wherein the second capacitor C_2 is a phase compensation capacitor disposed for ensuring the operation phase margin of the second amplifier OP2. The first terminal of the third switch SW_3 receives the audio signal s_a, and the second terminal thereof is coupled to the input terminal of the second amplifier OP2 and the first end of the second capacitor C_2, wherein the third switch SW_3 is turned on or off according to the second control signal s_c2.

To be specific, when the loudspeaker 140 is powered on, the first control signal s_c1 is enabled, and the second control signal s_c2 is disabled correspondingly, so that the first switch SW_1 and the second switch SW_2 of the first amplification module 320 are turned on and the third switch SW_3 of the second amplification module 330 is turned off. Thus, the first amplifier OP1 receives and amplifies the audio signal s_a to output the first amplified signal s_amp1 for driving the loudspeaker 140. However, because the driving capability of the first amplifier OP1 is low and the output terminal OT is not biased to the predetermined voltage level v_p yet, the first amplified signal s_amp1 is not able to drive the load of the loudspeaker 140 during the soft charge period.

It should be noted that the first amplifier OP1 of low driving capability may produce serious noise interference on the first amplified signal s_amp1. Thus, a first resistor R_1 with a large resistance should be disposed in order to reduce the noise in the first amplified signal s_amp1.

During the soft charge period, the voltage level v_out on the output terminal OT continuously increases until the voltage level v_out is equal to the predetermined voltage level v_p. Once the voltage level v_out is equal to the predetermined voltage level v_p, the second control signal s_c2 is enabled by the soft charge unit 310, and the first control signal s_c1 is disabled correspondingly, so that the first switch SW_1 and the second switch SW_2 of the first amplification module 320 are turned off according to the disabled first control signals_C1, and the third switch SW_3 of the second amplification module 330 is turned on according to the enabled second control signal s_c2. In other words, the audio amplifier apparatus 300 switches from the first amplification module 320 to the second amplification module 330 to amplify the audio signal s_a. Herein the second amplifier OP2 receives and amplifies the audio signal s_a to output the second amplified signal s_amp2 for driving the loudspeaker 140. Because the second amplifier OP2 has a high driving capability and the output terminal OT is also biased to the predetermined voltage level v_p, the loudspeaker 140 can properly output sound according to the second amplified signal s_amp2.

It should be noted that because the voltage levels on the input terminal and the output terminal of the second amplifier OP2 are set up in advance during the soft charge period by the first amplification module 320, when the soft charging action is stopped, the second amplifier OP2 can amplify the audio signal s_a according to aforementioned voltage levels, so that the pop noise generated when the soft charging action is stopped and the normal operation state is entered can be minimized.

Figure 4:
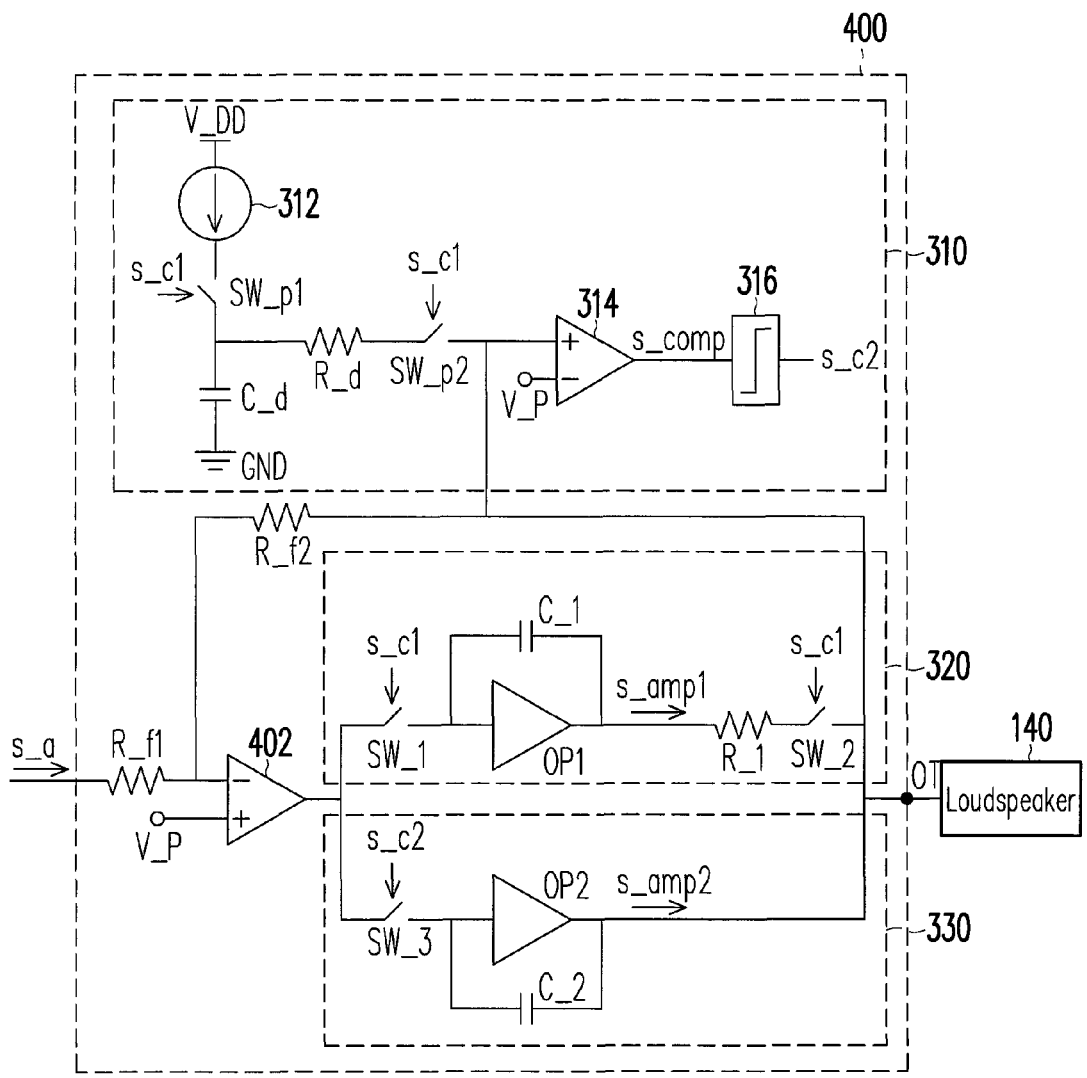
FIG. 4 is a circuit diagram of an audio amplifier apparatus 400 according to an embodiment of the invention.

FIG. 4 is a circuit diagram of an audio amplifier apparatus 400 according to an embodiment of the invention. The difference between the audio amplifier apparatus 400 in the present embodiment and the audio amplifier apparatus 300 in FIG. 3 is that the audio amplifier apparatus 400 further includes a pre-amplifier for pre-amplifying the audio signal s_a.

Referring to FIG. 4, the audio amplifier apparatus 400 further includes a pre-amplifier 402. The first input terminal of the pre-amplifier 402 is respectively coupled to the input terminal and the output terminal OT of the audio amplifier apparatus 400 through the first feedback resistor R_f1 and the second feedback resistor R_f2, the second input terminal thereof is coupled to the predetermined voltage V_P, and the output terminal thereof is coupled to the first amplification module 320 and the second amplification module 330. Herein before the audio signal s_a is input to the first amplification module 320 or the second amplification module 330, the pre-amplifier 402 further pre-amplifies the audio signal s_a to prohibit noises in the first amplification module 320 or the second amplification module 330, so as to reduce pop noise Additionally, the audio amplifier apparatus 400 has a same circuit structure as the audio amplifier apparatus 300. Thus, the characteristics of the components in the audio amplifier apparatus 400 can be referred to the embodiment illustrated in FIG. 3 and will not be described herein. Moreover, when the loudspeaker 140 is powered off, a discharging procedure corresponding to the charging procedure described in foregoing embodiment is executed to reduce the pop noise. The discharging procedure can be understood by those having ordinary knowledge in the art by referring to the embodiment described above therefore will not be described herein.

As described above, in an audio amplifier apparatus provided by an embodiment of the invention, a loudspeaker is soft-charged by using a soft charge unit to gradually increase the voltage level on an output terminal of the audio amplifier apparatus, and amplification modules of different driving capabilities are switched according to the soft-charged state of the loudspeaker, so that any spike current produced when the loudspeaker is switched from the soft-charged state to its normal operation state can be effectively eliminated. Moreover, because the voltage levels inside the amplification modules of the audio amplifier apparatus are set up when the loudspeaker is soft-charged, the loudspeaker can quickly enter its normal operation state after it is powered on. Thereby, in an embodiment of the invention, the pop noise produced when the loudspeaker is powered on is effectively reduced and the boot-up of the loudspeaker is sped up. In other words, a high-quality and comfortable audio experience is brought to the user.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An audio amplifier apparatus, suitable for driving a loudspeaker, the audio amplifier apparatus comprising:
a soft charge unit, coupled to the loudspeaker through an output terminal, and supplying a driving current according to a first control signal to soft charge the loudspeaker, so as to gradually increase a voltage level on the output terminal;
a first amplification module, coupled to the output terminal, receiving an audio signal according to the first control signal, and amplifying the audio signal to output a first amplified signal for driving the loudspeaker, wherein the first amplification module comprises:
a first amplifier, having an input terminal and an output terminal, wherein the input terminal of the first amplifier receives the audio signal, and the output terminal of the first amplifier outputs the first amplified signal; and a first capacitor, having a first end and a second end, wherein the first end of the first capacitor is coupled to the input terminal of the first amplifier, and the second end of the first capacitor is coupled to the output terminal of the first amplifier;

a second amplification module, coupled to the output terminal, receiving the audio signal according to a second control signal, and amplifying the audio signal to output a second amplified signal for driving the loudspeaker, wherein the soft charge unit generates the second control signal by comparing the voltage level on the output terminal with a predetermined voltage level, wherein when the voltage level on the output terminal is smaller than the predetermined voltage level, only the first amplification module amplifies the audio signal in response to the first control signal to output the first amplified signal for driving the loudspeaker, wherein when the voltage level on the output terminal reaches the predetermined voltage level, only the second amplification module amplifies the audio signal in response to the second control signal to output the second amplified signal for driving the loudspeaker;

a first resistor, having a first end and a second end, wherein the first end of the first resistor is coupled to the output terminal of the first amplifier;

a first switch, having a first terminal and a second terminal, and turned on or off according to the first control signal, wherein the first terminal of the first switch receives the audio signal, and the second terminal of the first switch is coupled to the input terminal of the first amplifier and the first end of the first capacitor; and a second switch, having a first terminal and a second terminal, and turned on or off according to the first control signal, wherein the first terminal of the second switch is coupled to the second end of the first resistor, and the second terminal of the second switch is coupled to the output terminal of the first amplifier, wherein when the voltage level on the output terminal is not equal to the predetermined voltage level, the first switch and the second switch are turned on according to the first control signal, and when the voltage level on the output terminal is equal to the predetermined voltage level, the first switch and the second switch are turned off according to the first control signal.

2. The audio amplifier apparatus according to claim 1, wherein a driving capability of the first amplification module is lower than a driving capability of the second amplification module.

3. The audio amplifier apparatus according to claim 1, wherein the predetermined voltage level is equal to 1/N of a voltage level of a supply voltage received by the audio amplifier apparatus, wherein N is a positive real number not smaller than 1.

4. The audio amplifier apparatus according to claim 1, wherein when the soft charge unit determines that the voltage level on the output terminal is equal to the predetermined voltage level, the soft charge unit enables the second control signal to allow the second amplification module to receive the audio signal, so as to generate the second amplified signal.

5. The audio amplifier apparatus according to claim 4, wherein when the second control signal is enabled, the first control signal is disabled so that the soft charge unit stops soft charging the loudspeaker and the first amplification module stops receiving the audio signal.

6. The audio amplifier apparatus according to claim 1, wherein the second amplification module comprises:

a second amplifier, having an input terminal and an output terminal, wherein the input terminal of the second amplifier receives the audio signal, and the output terminal of the second amplifier outputs the second amplified signal; and a second capacitor, having a first end and a second end, wherein the first end of the second capacitor is coupled to the input terminal of the second amplifier, and the second end of the second capacitor is coupled to the output terminal of the second amplifier.

7. The audio amplifier apparatus according to claim 6, wherein the second amplification module further comprises:

a third switch, having a first terminal and a second terminal, and turned on or off according to the second control signal, wherein the first terminal of the third switch receives the audio signal, and the second terminal of the third switch is coupled to the input terminal of the second amplifier and the first end of the second capacitor, wherein when the voltage level on the output terminal is not equal to the predetermined voltage level, the third switch is turned off according to the second control signal, and when the voltage level on the output terminal is equal to the predetermined voltage level, the third switch is turned on according to the second control signal.

8. The audio amplifier apparatus according to claim 6 further comprising:

a first feedback resistor, having a first end and a second end, wherein the first end of the first feedback resistor receives the audio signal, and the second end of the first feedback resistor is coupled to the input terminals of the first amplifier and the second amplifier; and a second feedback resistor, having a first end and a second end, wherein the first end of the second feedback resistor is coupled to the second end of the first feedback resistor and the input terminals of the first amplifier and the second amplifier, and the second end of the second feedback resistor is coupled to the soft charge unit and the output terminals of the first amplifier and the second amplifier.

9. The audio amplifier apparatus according to claim 6 further comprising:

a pre-amplifier, having a first input terminal, a second input terminal, and an output terminal, wherein the first input terminal of the pre-amplifier is coupled to the output terminal, the second input terminal of the pre-amplifier is coupled to a predetermined voltage, and the output terminal of the pre-amplifier is coupled to the first amplification module and the second amplification module.

10. The audio amplifier apparatus according to claim 1, wherein the soft charge unit comprises:

a current source, supplying the driving current according to a supply voltage;

a first soft charge switch, having a first terminal and a second terminal, and turned on or off according to the first control signal, wherein the first terminal of the first soft charge switch is coupled to the current source;

a delay capacitor, having a first end and a second end, wherein the first end of the delay capacitor is coupled to the second terminal of the first soft charge switch, and the second end of the delay capacitor is coupled to a ground voltage; and a delay resistor, having a first end and a second end, wherein the first end of the delay resistor is coupled to the second terminal of the first soft charge switch and the first end of the delay capacitor, and the second end of the delay resistor is coupled to the first amplification module and the second amplification module, wherein when the first soft charge switch is turned on according to the first control signal, the driving current gradually increases the voltage level on the output terminal by the delay capacitor and the delay resistor.

11. The audio amplifier apparatus according to claim 10, wherein the soft charge unit further comprises:

a second soft charge switch, having a first terminal and a second terminal, and turned on or off according to the first control signal, wherein the first terminal of the second soft charge switch is coupled to the second end of the delay resistor, and the second terminal of the second soft charge switch is coupled to the output terminal.

12. The audio amplifier apparatus according to claim 11, wherein when the soft charge unit determines that the voltage level on the output terminal is not equal to the predetermined voltage level, the first soft charge switch and the second soft charge switch are turned on according to the first control signal, and when the soft charge unit determines that the voltage level on the output terminal is equal to the predetermined voltage level, the first soft charge switch and the second soft charge switch are turned off according to the first control signal.

13. The audio amplifier apparatus according to claim 11, wherein the soft charge unit further comprises:

a comparator, having a first input terminal, a second input terminal, and an output terminal, wherein the first input terminal of the comparator is coupled to a predetermined voltage, the second input terminal of the comparator is coupled to the second terminal of the second soft charge switch and the output terminal, and the output terminal of the comparator outputs a comparison signal, wherein the comparator generates the comparison signal according to a comparison result between the voltage level on the output terminal and the predetermined voltage level; and a latch, coupled to the output terminal of the comparator, and generating the second control signal by latching the comparison signal.

14. The audio amplifier apparatus according to claim 1, wherein the first control signal and the second control signal are inverse to each other.

* * * * *